United States Patent [19]

Tachi et al.

[11] Patent Number: 4,943,344
[45] Date of Patent: Jul. 24, 1990

[54] ETCHING METHOD

[75] Inventors: Shinichi Tachi, Sayama; Kazunori Tsujimoto, Higashiyamato; Sadayuki Okudaira, Ome; Kiichiro Mukai, Hachioji, all of Japan

[73] Assignee: Hitachi, Ltd., Tokyo, Japan

[21] Appl. No.: 362,099

[22] Filed: Jun. 6, 1989

Related U.S. Application Data

[63] Continuation of Ser. No. 112,144, Oct. 26, 1987, abandoned.

[30] Foreign Application Priority Data

Oct. 29, 1986 [JP] Japan .................................. 61-255648

[51] Int. Cl.$^5$ ...................... H01L 21/308; B44C 1/22
[52] U.S. Cl. .................................... 156/643; 156/657; 156/659.1; 156/646; 156/662; 252/79.1; 430/297; 204/192.37
[58] Field of Search ..................... 156/643, 657, 659.1, 156/646, 662; 252/79.1; 430/297; 204/192.37

[56] References Cited

U.S. PATENT DOCUMENTS

| | | | |
|---|---|---|---|
| 3,669,774 | 6/1972 | Dismukes | 156/662 |
| 3,773,578 | 11/1973 | Glendinning | 156/662 |
| 3,816,196 | 6/1974 | La Coube | 156/643 |
| 4,214,946 | 7/1980 | Forget | 252/79.1 |
| 4,310,380 | 1/1982 | Flamm | 156/662 |
| 4,331,708 | 5/1982 | Hunter | 156/643 |
| 4,364,793 | 12/1982 | Graves | 156/662 |
| 4,383,885 | 5/1983 | Mayden | 156/643 |
| 4,412,119 | 10/1983 | Kamatsu | 156/643 |
| 4,490,209 | 12/1984 | Hartman | 252/79.1 |
| 4,521,275 | 6/1985 | Purdes | 252/79.1 |
| 4,711,698 | 12/1987 | Douglas | 156/643 |

FOREIGN PATENT DOCUMENTS

| | | | |
|---|---|---|---|
| 33472 | 4/1978 | Japan | 156/643 |
| 96529 | 6/1982 | Japan | 156/643 |
| 158627 | 8/1985 | Japan | 156/643 |
| 145832 | 7/1986 | Japan | 156/643 |

Primary Examiner—David L. Lacey
Assistant Examiner—Thomas M. Lithgow
Attorney, Agent, or Firm—Antonelli, Terry, Stout & Kraus

[57] ABSTRACT

A deep trench is formed by carrying out etching by using an etching gas free of carbon and silicon, which contains at least one member selected from the group consisting of fluorine, chlorine and bromine, while maintaining an article to be etched at such a temperature that the reaction probability between silicon and fluorine, chlorine or bromine contained in the etching gas is less than 1/10 of the reaction probability at 20° C. According to this method, a deep trench having a very narrow width and a large aspect ratio, which cannot be formed according to the conventional method, can be formed very promptly with much reduced side etching.

7 Claims, 3 Drawing Sheets

ETCHING METHOD

This is a continuation of application Ser. No. 112,144, filed Oct. 26, 1987 now abandoned.

BACKGROUND OF THE INVENTION

The present invention relates to an etching method. More specifically, the present invention relates to a dry etching method in which a deep trench or hole (hereinafter collectively referred to as "deep trench") can be effectively formed at a high precision on a semiconductor substrate.

Dry etching of a single crystal of silicon have been reported in many literature references, for example, Proc. Dry Process Symposium, page 121 (1984), and many methods have been proposed. Moreover, a method for forming a deep trench on a single crystal silicon substrate by dry etching is disclosed, for example, in Kure et al., Preprints of Lectures, Japanese Society of Applied Physics, 44th Autumn Meeting (1983), page 263.

In the conventional Si etching method, a chloride gas such as $CCl_4$ or $SiCl_4$ or a bromide gas such as $CBrF_3$ is used as the reaction gas, but the etching speed is as low as about 1000 Å/min and 30 minutes are necessary for forming, for example, a trench having a width of 1.0 μm and a depth of 3 μm. Furthermore, since the time required for etching is long, wearing of a mask is violent, and because of retreat of the edge portion of the mask, the width of the trench is changed by about 0.1 μm from the original size of the mask and it is difficult to form a trench at a high precision. Furthermore, in connection with the mask, a mask pattern having a thickness sufficient to resist etching to be conducted for such a long time as 30 minutes should be formed, and the precision of the size of the mask is low and a material having a sufficient etching resistance should be used as the mask material. Therefore, it is difficult to use a photoresist film as the mask.

SUMMARY OF THE INVENTION

It is an object of the present invention to solve the foregoing problems of the conventional technique and provide an etching method in which a trench having a small width and a large aspect ratio (depth/width ratio) can be promptly formed at a high precision.

According to the present invention, this object can be attained by using a gas free of carbon and silicon, which is composed of a compound containing at least one member selected from the group consisting of fluorine, chlorine and bromine or a simple substance of a member selected from the group consisting of fluorine, chlorine and bromine as the etching gas and etching an article to be etched at such a temperature that the reaction probability between the halogen atom in a plasma and the surface atom of the article to be etched is less than 1/10 of the reaction probability at 20° C. Incidentally, the reaction probability referred to in the instant specification and appended claims is defined as the ratio of the number of atoms of the article to be etched to the number of incident particles.

DETAILED DESCRIPTION OF THE PREFERRED EMBODIMENTS

Figure 1:
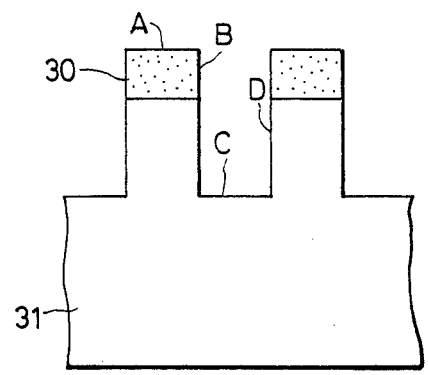
FIG. 1 is a diagram illustrating etching of the horizontal plane and side plane in the dry etching method.

In dry etching, positive ions and neutral particles generated in a plasma strike on the surface of an article to be etched, and the positive ions which react with atoms present on the surface strike on the surface vertically, but the movement of the neutral particles is a thermal movement and this movement has no directionality. The surface to be etched is divided into a horizontal plane A of a mask 30, a side plane B of the mask 30, a bottom plane C of an article 31 to be etched and a side plane D of the article 31 to be etched, as shown in FIG. 1, and the etching phenomenon on each plane will now be described. Positive ions and neutral particles (gas molecules, dissociated neutral atoms and molecules, and the like) strike on the horizontal planes A and C, and so-called ion-assist reaction is caused to occur on these horizontal planes A and C. On the side planes B and D, as the first approximation, only electrically neutral atoms and molecules dissociated in the plasma strike but ions do not strike. However, as the gas pressure is increased to about 0.1 to about 1 Torr, the incidence of ions is also caused on the side planes by scattering of gas molecules and ions and the first approximation does not hold. Accordingly, it can be considered that the first approximation holds only when the pressure is lower than 0.1 Torr. However, no practical trouble is caused even if the first approximation is made under a pressure of 0.1 to 0.5 Torr, because the quantity of scattered ions is small.

When the first approximation holds, on the side planes B and D, the gas molecules and the atoms and molecules formed by dissociation of the gas molecules react with the surface atoms on the side planes B and D. On the other hand, the above-mentioned atoms and molecules and the ions strike on the horizontal planes and by the synergistic effect of the atoms and molecules and the ions, the etching reaction of the surface atoms on the horizontal planes is advanced. In each reaction, the chemically active particles adsorbed on the surface react with the surface atoms to form a reaction product having a high vapor pressure, and the reaction product is isolated from the surface and is discharged in the form of a gas, whereby etching of the surface is advanced. Even if the reactivity between the reaction gas and the solid surface is high, the reaction product can not be isolated from the surface but is left on the solid surface to inhibit the advance of etching when the vapor pressure of the reaction product formed by the reaction of both is extremely low. The gas molecules do not react even if they strike on the surface, and they are isolated and discharged in the state of molecules and make no direct contribution to etching. Since the vapor pressure of the reaction product depends on the surface temperature of the solid, that is, the article to be etched, the temperature is an important factor at the etching step. Since also the reaction probability depends on the temperature, the etching speed is changed with a change in the temperature.

In the ordinary etching method, the article to be etched is placed on a sample stand cooled by water (about 15° C.) and is exposed to a plasma. Accordingly, on the article to be etched and the side planes of the mask, the etching speed is determined according to the reaction probability of the active species and the vapor pressure of the reaction product at the temperature of water used for cooling.

For example, when the reaction species is an F atom and the surface atom of the article to be etched is Si, the reaction probability is about 0.01, and the vapor pressure of the reaction product is at least $10^6$ times as high as the etching gas pressure. If these values and the fact that F atoms are formed in large quantities in the plasma are taken into consideration, it is seen that if etching is carried out while cooling Si, that is, the article to be etched with water, etching is very prominently caused on the side plane D of Si. Also in the case where an organic resist is used as the mask material, the reaction probability with F atoms is substantially equal to that in case of Si, and the side plane of the mask is prominently etched as in case of Si. Namely, when the discharge using the F atom as the active species is utilized, violent side etching is caused on both of the mask and Si, and fine processing becomes difficult. Furthermore, if etching is performed by small quantities of F atoms, etching is not so prominent on the side plane of the mask or the article to be etched, and the etching speed on the planes A and C as the bottom planes is reduced, with the result that the etching time is prolonged and side etching becomes prominent.

As is apparent from the foregoing description, when an article to be etched, which is cooled by water, is etched, high-precision fine processing by etching using F atoms as the active species is difficult. Accordingly, in etching for formation of a narrow trench to be used for fabrication of a trench capacitor or isolation of an element, a fluorine-containing gas has not been used but a chlorine- or bromine-containing gas has been used. The reason is that even when the article to be etched is subjected to etching in the water-cooled state, the reaction probability between the chlorine or bromine atom generated in the plasma and Si or the resist is very small and less than 1/100 of the reaction probability between the fluorine atom and Si and the vapor pressure of the reaction product is sufficiently high, and hence side etching is hardly caused.

On the horizontal planes A and C, as pointed out hereinbefore, also the ions perticipate in etching and the ion-assist reaction is caused. The reaction is activated by the energy possessed by the ions and therefore, the reaction probability of etching is increased. As taught in J. Vac. Sci. Technol., B4, No. (2)(1986), pages 459 through 467, on the ion-irradiated plane, the reaction probabilities in case of all of a fluorine-, chlorine- and bromine-containing gas are substantially equal and 0.1 to 0.5, and in reactions of F, Cl and Br atoms with Si, the etching speeds in the direction of the depth are not substantially different. However, as stated in the above-mentioned article, when $CCl_4$, $SiCl_4$, $CBrF_3$ or $C_2Br_2F_4$ is used as the etching gas, C or Si is deposited on the surface of the article to be etched during the etching operation because not only the halogen atom but also C or Si are contained in the gas molecules, and deposited C or Si becomes a serious factor inhibiting etching of Si. Namely, when the above mentioned gas is used as the etching gas for etching of single crystal Si, the etching speed in the depth direction is as low as about 1000 Å/min. On the other hand, on the horizontal plane of the mask, the ion-assist reaction is similarly caused on the surface of the organic film and the etching speed is as high as about 500 Å/min and therefore, when formation of a deep trench is intended, a photoresist film can hardly be used as the mask and a thick film of a material having a high etching resistance, such as $SiO_2$, is often used as the mask.

According to the present invention, all of the foregoing problems can be completely solved by using an etching gas free of Si or C and carrying our the etching operation while maintaining the temperature of an article to be etched at a low level as described above, and a deep trench can be formed at a high speed while effectively preventing the side etching.

More specifically, since the etching gas is free of Si or C, no deposit is accumulated on the surface of an article to be etched during the etching operation, and the etching speed in the depth direction is increased and a deep trench can be promptly formed. Furthermore, since etching is carried out in the state where the article to be etched is maintained at a low temperature as described above, the side etching of silicon is drastically reduced, and therefore, high-precision etching can be performed by using a resist film as the mask. It has been found that in this case, the etching speed on the surface of the resist film is reduced as the temperature is lowered, and the thickness of the resist film need not be increased.

As the result of investigations made by us, it has been found that the reaction probability between single crystal silicon and fluorine atom is $0.008\pm0.003$ when the temperature of the article to be etched is 20° C., but the reaction probability is $0.005\pm0.003$ at $-20°$ C., $0.002\pm0.001$ at $-40°$ C. and $0.0008\pm0.0005$ at $-60°$ C. Thus, it has been confirmed that if the article to be etched is cooled to $-60°$ C., the reaction probability is reduced to 1/10 of the value at 20° C.

In etching of silicon by using a plasma of a fluorine gas or a fluoride gas, if the reaction probability between fluorine atom and silicon is reduced, the quantity of the side etching is correspondingly reduced. Accordingly, it has been confirmed that reduction of the temperature of the article to be etched is very effective for controlling the side etching. More specifically, it has been confirmed that if the reaction probability is reduced to 1/10, the quantity of the side etching is reduced to 1/5 to 1/10 and a trench having a small width and a large aspect ratio, formation of which is difficult according to the conventional technique, can be formed at a high precision. Accordingly, for anisotropic processing of silicon by using a fluorine-containing gas, it is preferred that the temperature of the article to be etched be lowered below $-60°$ C. At such a low temperature, particles from the plasma are readily adsorbed on the surface of the cooled article to be etched. The etching speed in the depth direction is increased with increase of the quantity of the adsorbed particles. Namely, when the article to be etched is maintained at a low temperature as described above, the amount of fluorine adsorbed on the surface of the silicon substrate is extremely increased and if the adsorbed fluorine is irradiated with ions from the plasma, the etching reaction between fluorine and silicon is promoted by the energy possessed by the ions. In this case, the larger the amount of fluorine adsorbed on the surface of the silicon substrate, needless to say, the higher the etching speed. Accordingly, by cooling the silicon substrate as the article to be etched below −60° C., there can be attained effects of increasing the etching speed and rendering anisotropic processing possible with much reduced side etching.

The reaction probability between chlorine atom and silicon is $10^{-3}$ to $10^{-4}$, and the temperature at which the reaction probability is reduced to 1/10 was found to be −40° C. Accordingly, in the case where etching is carried out by using a chlorine gas or a chloride gas as the etching gas and the temperature of the article to be etched is lowered below −40° C., processing excellent in the anisotropy can be performed at a high speed.

The temperature at which the reaction probability between bromine atom and silicon is reduced to ½ of the reaction probability at 20° C. was found to be −10° C. Accordingly, in the case where high-speed anisotropic etching of silicon is carried out by a plasma of a bromine gas or a bromide gas, good results can be obtained if the article to be etched is maintained at a temperature lower than −10° C.

The reason why the preferred temperature range differs according to the kind of the halogen is that the activation energy of the reaction between the halogen atom and silicon differs according to the kind of the halogen atom. The activation energy is smallest in case of fluorine atom and the activation energy is increased in order of chlorine and bromine. Therefore, in case of a gas containing bromine, the temperature suitable for etching is higher than in case of a gas containing other halogen.

Increase of the etching speed results in shortening of the etching time, and in order to increase the etching speed, it is necessary to increase the number of particles participating in etching. According to the present invention, by dint of a phenomenon peculiarly caused at a low temperature, that is, a phenomenon that the amount of the halogen atom adsorbed on the surface of an article to be etched is increased as the temperature is lowered, increase of the etching speed is attained.

According to the present invention, a gas free of Si and C, which contains at least one member selected from the group consisting of F, Cl and Br, is used as the etching gas, as pointed out hereinbefore.

As the gas to be used in the present invention, there can be mentioned, for example, $F_2$, $SF_6$, $BF_3$, $ClF_3$, $NF_3$, $PF_3$, $Cl_2$ and $Br_2$, and these gases may be used singly or in the form of mixtures of two or more of them.

As the etching apparatus, there can be used a known cathode-coupled parallel plate etching apparatus and a known microwave plasma etching apparatus. A customarily adopted value can be adopted for the gas pressure or the like.

Figure 2:
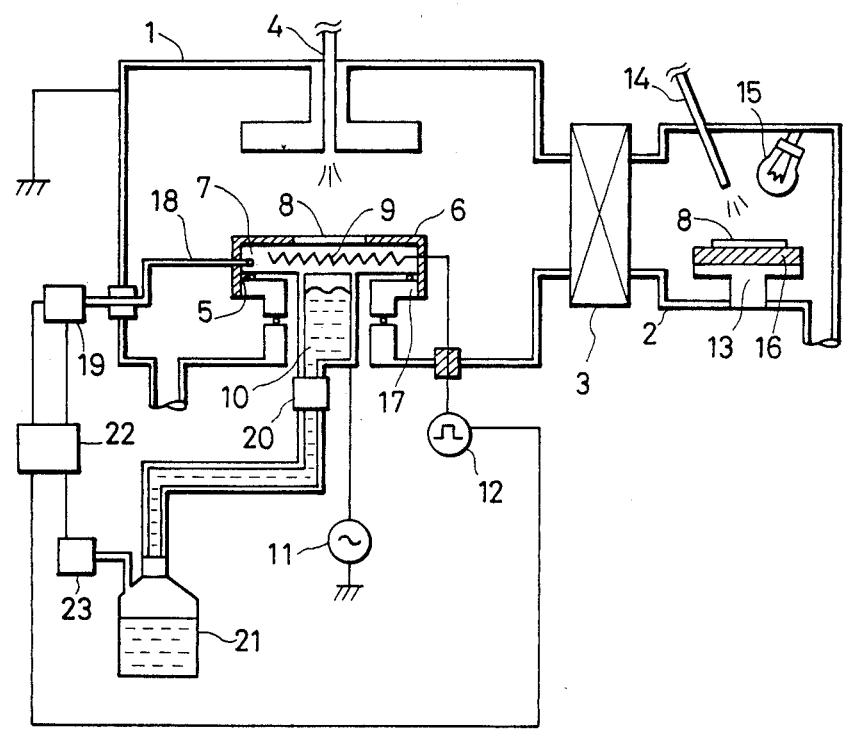
FIG. 2 is a diagram illustrating an example of a parallel plate-shaped etching apparatus for use in carrying out the present invention.

Various etching apparatuses can be used in carrying out the present invention. FIG. 2 illustrates an example of a radio-frequency parallel plate discharge plasma etching apparatus to be used in the present invention. An article 8 to be etched is placed on a cooled sample stand 7, and after the plasma treatment, the article 8 is delivered to a post-treatment chamber and heated therein. The cooled sample stand 7 arranged in a vacuum vessel 1 is heated and cooled by a heater 9 and a cooling medium 10 to control the output of a thermocouple 18, whereby the temperature of the article 8 to be etched is maintained at a desired level. A gas plasma is generated by applying a high-frequency electric power 11 to a gas introduced from a gas inlet 4, and the article 8 is etched. The temperature control is accomplished by actuating a cooling medium supply control system 23 and a heater power source 12 by a detector 19 for detecting the output of the thermocouple 18 and a feedback mechanism 22. After the article 8 has been etched, the article 8 is transferred into the post-treatment chamber 2 and heat-treated on a quartz stand 16 by a heating lamp 15. In the following examples, etching of single crystal silicon was carried out in the above-mentioned apparatus by using an organic resist film. By the term "deep trench etching" used herein is meant etching in which the depth of a trench obtained by etching of Si by using a mask having a width smaller than 1.0 μm is at least two times the width of the opening and the side etching width is less than 1/10 of the trench width.

The present invention will now be described in detail with reference to the following examples.

EXAMPLE 1

Etching was carried out by using $F_2$ gas as the etching gas under a gas pressure of 100 mTorr at an input electric power of 300 W and a flow rate of 10 sccm while maintaining the silicon substrate temperature below −100° C. A trench having a depth of 2.0 μm could be formed at a mask width of 1.0 μm and a mask distance of 1.0 μm with a side etching width of 0.05 μm. When etching was carried out by increasing the input electric power to 400 W and 500 W while other conditions were not changed, it was found that the optimum temperatures were lower than −90° C. and lower than −80° C., respectively. When the input electric power was set at 400 W while changing the gas pressure to 80 mTorr, 60 mTorr, 40 mTorr, 20 mTorr, 10 mTorr and 6 mTorr, good etching as described above could be attained at temperatures lower than −85° C., −80° C., −75° C., −73° C., −70° C. and −60° C., respectively, and it was found that the temperature range can be broadened by reducing the gas pressure. Namely, it was found that in order to form a deep trench on an Si substrate by using $F_2$ gas, it is preferred that the article to be etched be maintained at a low temperature below −60° C., the input electric power be increased and the gas pressure be reduced. However, the etching speed in the depth direction was increased when the gas pressure was high and the input electric power was large. Namely, the etching speed was 2500 Å/min at 300 W, 10 mTorr and −70° C. and was higher than 5000 Å under 100 mTorr.

It was confirmed that if the temperature is maintained below −90° C., the side etching width can be controlled below 0.03 μm. However, if the temperature was lower than −150° C., because of reduction of the vapor pressure of $SiF_4$, ions having a higher ion energy became necessary, and a lower gas pressure and a higher input electric power were required. Therefore, it was confirmed that good results can be obtained if etching is carried out while maintaining the article to be etched at a temperature of −60° to −190° C.

It was found that if $F_2$ gas was used for low-temperature etching, good effects were obtained in both of increase of the etching speed and prevention of the side etching in formation of a deep trench on Si.

An organic resist film could be used as the mask material and as compared with the case where $SiO_2$ or the like was used as the mask, the step number could be drastically reduced and the precision could be enhanced.

EXAMPLE 2

Figure 3:
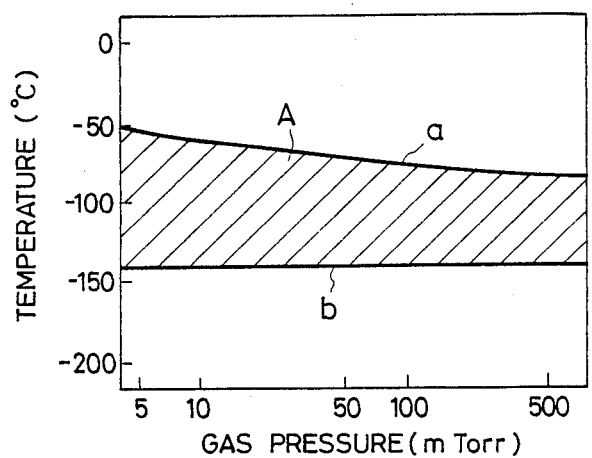
FIGS. 3, 4, and 5 are diagrams illustrating preferred ranges of the pressure and temperature to be adopted when $SF_6$, $NF_3$ and $Cl_2$ are used as the etching gas, respectively.

In the case where plasma etching was carried out by using $SF_6$ gas as the main discharge gas, a trench having a width of 1 μm and a depth of 2 μm could be formed on single crystal silicon with a side etching width of 0.05 μm, if the gas pressure was maintained at 100 mTorr, the input electric power was maintained at 300 W and the cooling temperature was adjusted below −100° C. In this case, the etching speed was higher than 4000 Å/min and the time required for formation of the deep trench could be shortened to less than ¼ of the time required in the conventional technique. It was found that the etching speed was smaller by about 20% than the etching speed attained by using $F_2$ gas. If the gas pressure was changed, as in case of $F_2$ gas, the temperature suitable for formation of a deep trench was changed. The upper limit temperature for attaining a side etching quantity of 0.05 μm was as indicated by curve a in FIG. 3, and the range below this curve a was suitable for formation of a deep trench. This etching temperature range was changed according to the input electric power. Namely, if the input electric power was increased to 400 W from 300 W, a deep trench could be formed at a temperature higher by about 10° C. under the same gas pressure with the same side etching quantity. At an input electric power of 500 W, a deep trench could be formed at a temperature higher by about 15° C. than the temperature at an input electric power of 300° C. Namely, it was confirmed that if the input electric power was increased, trench etching could be performed within a broader temperature range. Also in view of the etching speed, it is preferred that the input electric power be increased. However, if the electric power was excessively increased, the selection ratio (the ratio of the speed of etching of the silicon substrate to the speed of etching of the mask, was too small. Therefore, it was confirmed that too large an input electric power should be avoided. If the temperature was lower than about −140° C., $SF_6$ was precipitated. Accordingly, it was confirmed that a temperature lower than −140° C. should be avoided and the region A defined by the curve a and the straight line b in FIG. 3 was a preferred region.

Furthermore, it was confirmed that when $SF_6$ gas was used as the etching gas, good results could be obtained by using an organic resist film as the mask.

EXAMPLE 3

When $NF_3$ gas was used as the main discharge gas, a tendency similar to the tendency observed in case of $F_2$ was observed. In case of etching using $SF_6$, deposition of S on the surface was observed, but etching using $NF_3$ was advantageous in that N in $NF_3$ was discharged in the form of $N_2$, and therefore, the etching speed was increased and the surface contamination was reduced.

Figure 4:
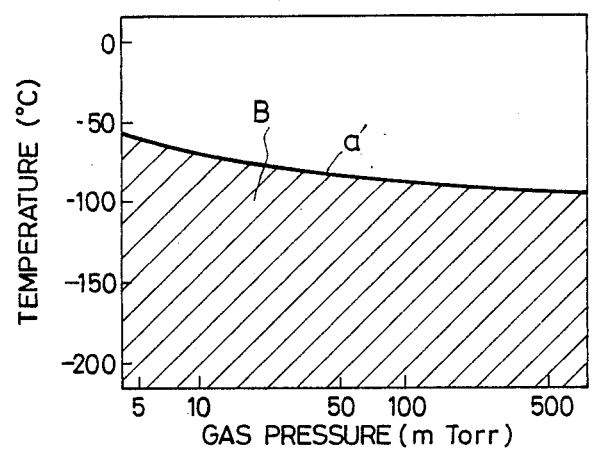

It was found that good etching could be realized if the pressure of the reaction gas and the temperature of the article to be etched were chosen within a region B below curve a' in FIG. 4. Incidentally, FIG. 4 illustrates the conditions at an input electric power of 300 W. If the input electric power was increased, good etching for formation of a deep trench could be accomplished even at a temperature higher by about 10° C.

An organic resist film could be used as the mask material, and as in the case where $F_2$ or $SF_6$ was used as the etching gas, the number of the required steps could be greatly reduced as compared with the case of $SiO_2$ customarily used for formation of a trench, and the precision was highly improved.

When $PF_5$ was used as the main discharge gas, results similar to the results obtained when $SF_6$ was used were obtained. Conditions for obtaining good results were substantially the same as the conditions, shown in FIG. 3, required for obtaining good results when $SF_6$ was used.

It was confirmed that if $F_2$, $SF_6$, $PF_5$ and $NF_3$ were used as the etching gas for formation of a deep trench having a width smaller than 1.0 μm on a substrate, the etching speed was high and the side etching width was very small and less than 0.05 μm, and therefore, these gases were suitable for forming a fine trench promptly at a high precision

EXAMPLE 4

In this example, single crystal silicon was etched by using $Cl_2$ gas as the main discharge gas to form a deep trench. Also in this example, an etching speed in the depth direction, which was substantially the same as the etching speeds obtained in the foregoing examples, was obtained, and the side etching width could be reduced to less than ½ of the side etching width obtained when the fluorine-containing gas was used. An organic resist film could be used as the mask, and the etching speed was lower by about 50 to about 70% than the etching speed attained when the fluorine-containing gas was used.

More specifically, $Cl_2$ gas was very effective for forming a trench having a depth larger than the width on single crystal silicon by etching.

Figure 5:
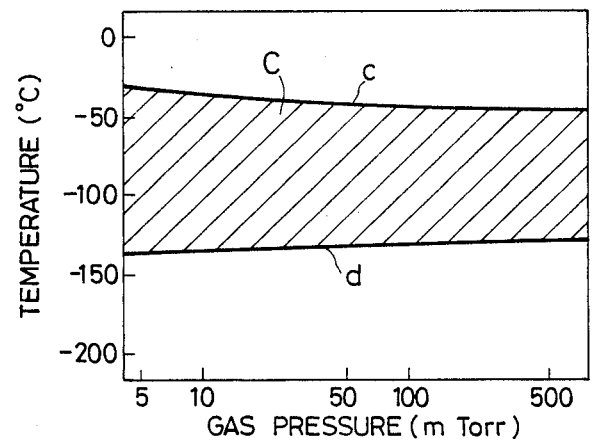

The pressure of $Cl_2$ gas and the temperature of the article to be etched, which were suitable for forming a deep trench on a silicon substrate at an input electric power of 500 W, were in the region C defined by straight line c and straight line d in FIG. 5. In the region above straight line c, the side etching width was larger than 0.05 μm and the vapor pressure of $Cl_2$ gas at −130° C. was about 0.1 Torr, and therefore, etching was difficult. In the region C defined by straight lines c and d, good results were obtained. In the case where the input electric power was increased to 400 W, the lower limit temperature became lower by about 5° C. than the level of straight line d and the upper limit temperature became higher by about 5° C. than the level of straight line c, and thus, it was confirmed that the preferred range was broadened in this case. At a smaller input electric power, the upper limit temperature was slightly lowered and the lower limit temperature was slightly elevated, but a deep trench could be formed at a high precision in the region surrounded by both the straight lines.

EXAMPLE 5

A deep trench was formed on Si by etching using $Br_2$ gas as the main discharge gas in the present example. When etching was carried out at an input electric power of 300 W under a gas pressure of 6.5 mTorr while maintaining the article to be etched at −60° C., a deep trench having a width of 0.5 μm and a depth of 4 μm could be formed by conducting etching for about 10 minutes. The side etching width was 0.05 μm. Temperatures at which good results were obtained when $Br_2$ gas was used were in the range of −10° to −100° C. If the temperature was lower than −100° C., deposition of Br₂ gas was caused on the surface of the article to be etched. Therefore, it was confirmed that an etching temperature lower than −100° C. should not be adopted.

EXAMPLE 6

When $F_2$, $SF_6$, $PF_5$, $BF_3$, $ClF_3$, $Cl_2$ and $Br_2$ gases were singly used, deep trenches could be formed, but if a mixture of a plurality of the gases was used, better results could be obtained with respect to increase of the etching speed and the selection ratio. It was confirmed that if the temperature of the article to be etched was lower than the upper limit temperature of the gas having a lower upper limit temperature in the gas mixture, especially good results could be obtained.

It was confirmed that a method in which a plurality of gases were alternately introduced at certain time intervals was very effective for improving the selection ratio.

EXAMPLE 7

Figure 6:
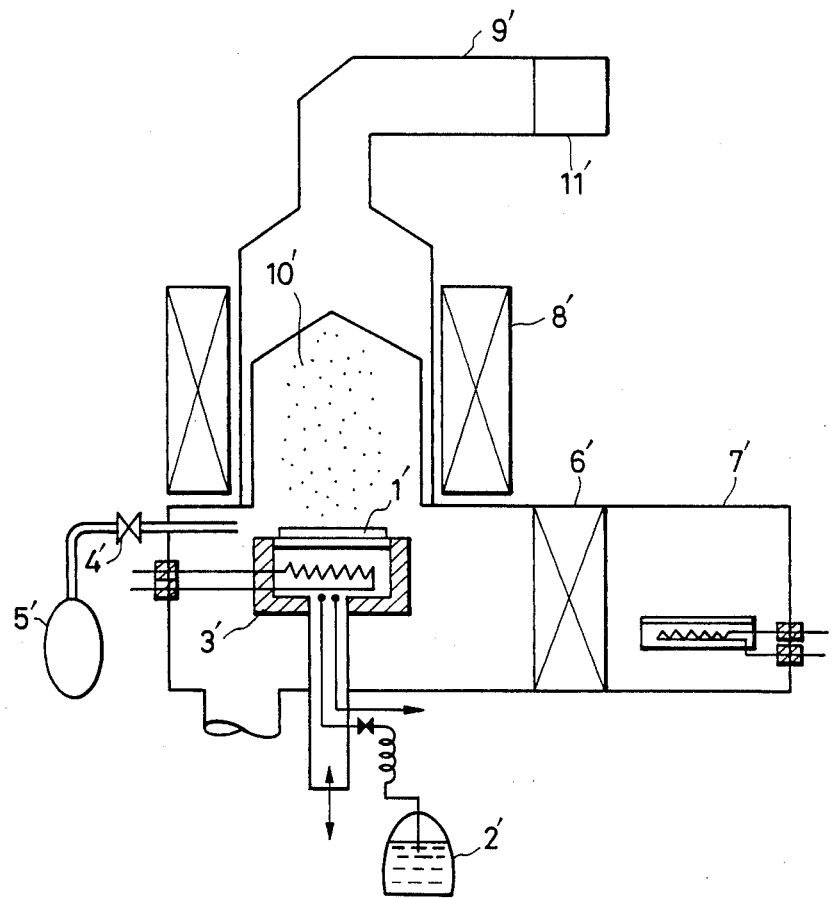
FIG. 6 is a diagram illustrating an example of a microwave plasma etching apparatus for use in carrying out the present invention.

In each of Examples 1 through 6 given hereinabove, the parallel plate etching apparatus shown in FIG. 2 was used. In the present example, however, a microwave etching apparatus shown in FIG. 6 was used. This apparatus was constructed by adding a cooling mechanism for maintaining an article to be etched at a low temperature to a known microwave etching apparatus. In the present example, the article 1′ to be etched was maintained at a low temperature by feeding liquefied nitrogen to a sample stand 3′ provided with a vertically movable mechanism from a Dewar flask 2′ storing liquefied nitrogen. Furthermore, heating was simultaneously effected by a heater 4′ to improve the temperature controllability. A high-frequency voltage could be simultaneously applied to the sample stand 3′, whereby a bias voltage could be applied to the article 1′ to be etched. The surface of the sample stand 3′, except the portion where the article 1′ was placed, was covered with a Teflon film, so that the cooled surface was not directly contacted with the gas. The surface of the sample stand 3′ may be exposed without covering with the Teflon film. Furthermore, a method in which the article to be etched can be maintained at a temperature lower than the predetermined level can be adopted instead of the cooling method using liquefied nitrogen.

Figure 7:
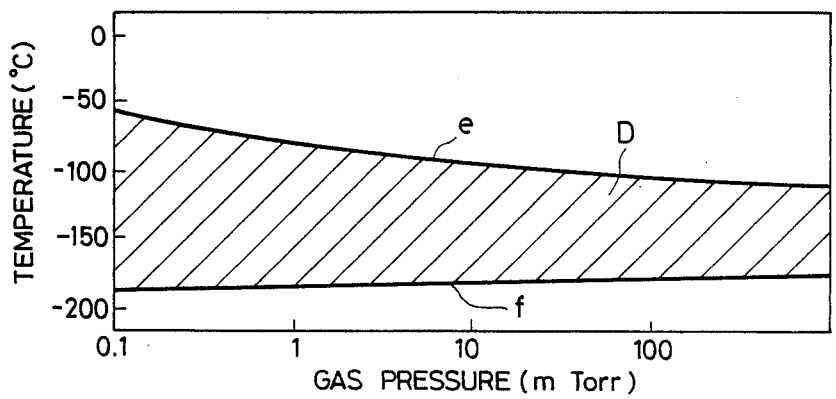
FIG. 7 is a diagram illustrating preferred ranges of the pressure and temperature to be adopted when a microwave plasma etching apparatus is used as the etching apparatus and $F_2$ is used as the reaction gas.

Single crystal silicon was etched in the abovementioned microwave etching apparatus by using $F_2$ gas as the etching gas. In the case where microwave etching was carried out at a bias voltage of 150 V, a good deep trench could be formed under a gas pressure of $10^{-4}$ to 1 Torr in the region D defined by curve e and line f in FIG. 7.

In the present example, the article to be etched was maintained at a temperature of −130° C., and if the gas pressure and bias voltage were adjusted to 100 mTorr and 150 V, the etching speed was 1 μm/min. This value is about two times the etching speed at the Vf discharge. Accordingly, it was confirmed that the method of the present example was especially effective for shortening the deep trench-forming treatment time.

Thus, it was confirmed that an apparatus constructed by adding a low-temperature sample table to a sheet-fed etching apparatus was very effective for improving the throughput and especially effective for the treatment of a silicon wafer having a diameter larger than 6 inches.

EXAMPLE 8

When $SF_6$, $PF_5$, $NF_3$ and $Cl_2$ were used as the etching gas, deep trenches could be formed on Si by low-temperature microwave etching. In case of each of the foregoing gases, if the temperature was adjusted to −80° to −160° C. and the bias voltage was adjusted above −50 V, a deep trench could be formed at an etching speed of at least 5000 Å/min with a side etching width smaller than 1/10 of the etching width. If the bias voltage was lower than −50 V, the etching speed was reduced but the damage could be much decreased. Therefore, it was confirmed that if it is necessary to drastically reduce the damage at the etching step, it is preferred that etching be carried out while reducing the bias voltage.

EXAMPLE 9

In case of low-temperature microwave (etching) using $Br_2$ gas, a good deep trench could be formed at a sample temperature of −10° to −60° C.

In each of foregoing Examples 7 through 9, an organic resist film could be used as the etching mask. Therefore, it was confirmed that according to the present invention, as compared with the conventional method using $SiO_2$ as the mask, the step number could be decreased and the precision could be improved. In order to improve the density of integration of a semiconductor apparatus, it becomes very important to form a deep trench on a single crystal silicon substrate and use this deep trench as a capacitor or an isolation trench between elements. As is apparent from the results obtained in Examples 1 through 9, the present invention is especially effective for realizing a trench capacitor or an isolation trench having a U-shaped section.

More specifically, according to the present invention, side etching can be much reduced and the etching speed can be increased. Furthermore, since an organic resist film can be used as the etching mask, there can be attained effects of shortening the treatment time and reducing the step number in formation of a deep trench on single crystal silicon, and a deep trench can be promptly formed with a very high precision. Therefore, a deep trench having a very narrow width, that cannot be formed according to the conventional method, for example, a deep trench having an aspect ratio of 10 with a width of 0.5 μm (the depth being 5 μm) can be formed according to the present invention, and the present invention is very effective for improving the density of integration of a semiconductor apparatus.

What is claimed is:

1. An etching method for etching a single crystal silicon substrate, comprising:
   providing an organic film as an etching mask on the silicon substrate, having at least one opening which exposes at least one portion of the silicon substrate,
   etching at least one exposed portion with a plasma of an etching gas and forming at least one trench on the silicon substrate by continued etching of the at least one exposed portion, wherein the etching gas contains neither carbon nor silicon but is sulphur hexafloride ($SF_6$), and wherein etching is carried out while the silicon substrate is maintained at a temperature lower than −100° C. so that the reaction probability between the fluorine which is contained in the plasma and the surface atoms of the silicon substrate is less than 1/10 of the reaction probability at 20° C., thereby achieving a high selection ratio of etching speed of said silicon substrate to etching speed of said organic resist film.

2. An etching method according to claim 1, wherein said at least one trench has an opening having a width not larger than 1.0 μm.

3. An etching method according to claim 1, wherein a difference between a width of said trench and a width of said at least one opening is not larger than 0.1 μm.

4. An etching method for etching a silicon substrate, comprising:
etching at least one exposed portion of the silicon substrate by contacting the at least one exposed portion with a plasma of an etching gas and forming at least one trench on the silicon substrate by continued etching of the at least one exposed portion, wherein the etching gas contains neither carbon nor silicon but is a chlorine-containing gas, and wherein etching is carried out while the silicon substrate is maintained at a temperature lower than −40° C. so that the reaction probability between the chlorine which is contained in the plasma and the surface atoms of the silicon substrate is less than 1/10 of the reaction probability at 20° C.

5. An etching method according to claim 4, wherein the chlorine-containing gas is $Cl_2$.

6. An etching method for etching a silicon substrate, comprising:
etching at least one exposed portion of the silicon substrate by contacting the at least one exposed portion with a plasma of an etching gas and forming at least one trench on the silicon substrate by continued etching of the at least one exposed portion, wherein the etching gas contains neither carbon nor silicon but is a bromine-containing gas, and wherein etching is carried out while the silicon substrate is maintained at a temperature lower than −10° C. so that the reaction probability between the bromine which is contained in the plasma and the surface atoms of the silicon substrate is less than 1/10 of the reaction probability at 20° C.

7. An etching method according to claim 6, wherein the bromine-containing gas is $Br_2$.

* * * * *